US006924760B1

(12) United States Patent
McLeod et al.

(10) Patent No.: US 6,924,760 B1
(45) Date of Patent: Aug. 2, 2005

(54) HIGHLY ACCURATE SWITCHED CAPACITOR DAC

(75) Inventors: Scott C. McLeod, Oro Valley, AZ (US); Aniruddha Bashar, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 10/789,903

(22) Filed: Feb. 27, 2004

(51) Int. Cl.[7] .............................................. H03M 1/66
(52) U.S. Cl. ...................................... 341/144; 341/172
(58) Field of Search ................................ 341/144, 120, 341/150, 136, 172

(56) References Cited

U.S. PATENT DOCUMENTS

| | | | | |
|---|---|---|---|---|
| 4,399,426 A | * | 8/1983 | Tan | 341/120 |
| 4,451,820 A | * | 5/1984 | Kapral | 341/150 |
| 4,523,179 A | * | 6/1985 | Kapral | 341/136 |
| 4,968,989 A | * | 11/1990 | Olmstead et al. | 341/150 |
| 5,281,867 A | * | 1/1994 | Campbell et al. | 327/91 |
| 5,376,936 A | * | 12/1994 | Kerth et al. | 341/150 |
| 5,440,305 A | * | 8/1995 | Signore et al. | 341/120 |
| 5,684,487 A | * | 11/1997 | Timko | 341/172 |
| 5,821,892 A | * | 10/1998 | Smith | 341/150 |
| 5,889,485 A | * | 3/1999 | Schneider | 341/150 |
| 5,889,486 A | * | 3/1999 | Opris et al. | 341/150 |
| 6,154,162 A | * | 11/2000 | Watson et al. | 341/150 |
| 6,169,508 B1 | * | 1/2001 | Edwards | 341/150 |
| 6,252,454 B1 | * | 6/2001 | Thompson et al. | 330/9 |
| 6,304,608 B1 | * | 10/2001 | Chen et al. | 375/252 |
| 6,404,375 B1 | * | 6/2002 | Munoz et al. | 341/172 |
| 6,693,574 B2 | * | 2/2004 | Yamamura | 341/150 |
| 6,720,896 B2 | * | 4/2004 | Semmler et al. | 341/120 |
| 6,753,800 B2 | * | 6/2004 | Ou | 341/144 |
| 6,768,436 B1 | * | 7/2004 | Chuang | 341/143 |

OTHER PUBLICATIONS

Fredriksen, Einar; Tormod Njolstad, and Runar Sorasen, "Evaluation of algorithms for dynamic element matching in a Delta–Sigma A/D converter," undated, one page. (No date).

Andersson, Niklas U., "A Comparison of Dynamic Element Matching in Digital–to–Analog Converters," undated, 17 pages. (No date).

(Continued)

Primary Examiner—Jean Bruner Jeanglaude
(74) Attorney, Agent, or Firm—Meyertons Hood Kivlin Kowert & Goetzel, P.C.; Jeffrey C. Hood

(57) ABSTRACT

In one set of embodiments the invention comprises a highly accurate, low-power, compact size DAC utilizing charge redistribution techniques. Two complementary conversions may be performed and added together to form a final DAC output voltage by performing charge redistribution a first time, and again a second time in a complementary fashion, followed by a summing of the two charge distributions, in effect canceling the odd order capacitor mismatch errors. By canceling all odd order mismatch errors the accuracy of the DAC may become a function of the square of the mismatch of the two capacitors, resulting in greatly increased accuracy. When performing the complementary conversions for multiple bits, the sequence in which each of the two capacitors is charged may be determined to minimize the even-order errors, especially second-order errors. The DEM technique may be applied, in conjunction with the complementary conversions, with less oversampling than required by current DEM implementations, resulting in even-order errors being substantially reduced in addition to all odd-order errors being eliminated.

43 Claims, 5 Drawing Sheets

OTHER PUBLICATIONS

Andersson, Niklas U.; K. Ola Andersson, Mark Vesterbacka, and J. Jacob Wikner, "Models and Implementation of a Dynamic Element Matching DAC," Analog Integrated Circuits and Signal Processing, Jan. 2003, vol. 34, No. 1, pp. 5–6(2).

Tuthill, Mike, "A Switched–Current, Switched–Capacitor Temperature Sensor in 0.6–$\mu$m CMOS," IEEE Journal of Solid State Circuits, vol. 33, No. 7, Jul. 1998, pp. 1117–1122.

Rombouts, P.; L. Weyten, J. Raman, and S. Audenaert, "Capacitor Mismatch Compensation for the Quasi–Passive Switched–Capacitor DAC," IEEE Transactions on Circuits and Systems–I: Fundamental Theory and Applications, vol. 45, No. 1, Jan. 1998, pp. 68–71.

* cited by examiner

|  | m | n | Error Terms |
|---|---|---|---|
| Bit 1 | 1 | 1 | $1/2 * (-\Delta^2)$ |
|  | 2 | 0 | $1/2 * (\Delta^2)$ |
| Bit 2 | 2 | 1 | $1/4 * (-\Delta^2)$ |
|  | 3 | 0 | $1/4 * (3*\Delta^2)$ |
| Bit 3 | 2 | 2 | $1/8 * (-2*\Delta^2 + \Delta^4)$ |
|  | 3 | 1 | $1/8 * (-\Delta^4)$ |
|  | 4 | 0 | $1/8 * (6*\Delta^2 + \Delta^4)$ |
| Bit 4 | 3 | 2 | $1/16 * (-2*\Delta^2 + \Delta^4)$ |
|  | 4 | 1 | $1/16 * (2*\Delta^2 - 3*\Delta^4)$ |
|  | 5 | 0 | $1/16 * (10*\Delta^2 + 5*\Delta^4)$ |
| Bit 5 | 3 | 3 | $1/32 * (-3*\Delta^2 + 3*\Delta^4)$ |
|  | 4 | 2 | $1/32 * (-\Delta^2 - \Delta^4)$ |
|  | 5 | 1 | $1/32 * (5*\Delta^2 - 5*\Delta^4)$ |
|  | 6 | 0 | $1/32 * (15*\Delta^2 + 15*\Delta^4)$ |
| Bit 6 | 4 | 3 | $1/64 * (-3*\Delta^2 + 3*\Delta^4)$ |
|  | 5 | 2 | $1/64 * (\Delta^2 - 5*\Delta^4)$ |
|  | 6 | 1 | $1/64 * (9*\Delta^2 - 5*\Delta^4)$ |
|  | 7 | 0 | $1/64 * (21*\Delta^2 + 35*\Delta^4)$ |
| Bit 7 | 4 | 4 | $1/128 * (-4*\Delta^2 + 6*\Delta^4)$ |
|  | 5 | 3 | $1/128 * (-2*\Delta^2)$ |
|  | 6 | 2 | $1/128 * (4*\Delta^2 - 10*\Delta^4)$ |
|  | 7 | 1 | $1/128 * (14*\Delta^2)$ |
|  | 8 | 0 | $1/128 * (28*\Delta^2 + 70*\Delta^4)$ |
| Bit 8 | 5 | 4 | $1/256 * (-4*\Delta^2 + 6*\Delta^4)$ |
|  | 6 | 3 | $1/256 * (-6*\Delta^2)$ |
|  | 7 | 2 | $1/256 * (8*\Delta^2 - 14*\Delta^4)$ |
|  | 8 | 1 | $1/256 * (20*\Delta^2 + 14*\Delta^4)$ |
|  | 9 | 0 | $1/256 * (36*\Delta^2 + 126*\Delta^4)$ |
| Bit 9 | 5 | 5 | $1/512 * (-5*\Delta^2 + 10*\Delta^4)$ |
|  | 6 | 4 | $1/512 * (-3*\Delta^2 + 2*\Delta^4)$ |
|  | 7 | 3 | $1/512 * (3*\Delta^2 - 14*\Delta^4)$ |
|  | 8 | 2 | $1/512 * (13*\Delta^2 - 14*\Delta^4)$ |
|  | 9 | 1 | $1/512 * (27*\Delta^2 + 42*\Delta^4)$ |
|  | 10 | 0 | $1/512 * (45*\Delta^2 + 210*\Delta^4)$ |
| Bit 10 | 6 | 5 | $1/1024 * (-5*\Delta^2 + 10*\Delta^4)$ |
|  | 7 | 4 | $1/1024 * (-\Delta^2 - 6*\Delta^4)$ |
|  | 8 | 3 | $1/1024 * (7*\Delta^2 - 22*\Delta^4)$ |
|  | 9 | 2 | $1/1024 * (19*\Delta^2 - 6*\Delta^4)$ |
|  | 10 | 1 | $1/1024 * (35*\Delta^2 + 90*\Delta^4)$ |
|  | 11 | 0 | $1/1024 * (55*\Delta^2 + 330*\Delta^4)$ |
| Bit 11 | 6 | 6 | $1/2048 * (-6*\Delta^2 + 15*\Delta^4)$ |
|  | 7 | 5 | $1/2048 * (-4*\Delta^2 + 5*\Delta^4)$ |
|  | 8 | 4 | $1/2048 * (2*\Delta^2 - 17*\Delta^4)$ |
|  | 9 | 3 | $1/2048 * (12*\Delta^2 - 27*\Delta^4)$ |
|  | 10 | 2 | $1/2048 * (26*\Delta^2 + 15*\Delta^4)$ |
|  | 11 | 1 | $1/2048 * (44*\Delta^2 + 165*\Delta^4)$ |
|  | 12 | 0 | $1/2048 * (66*\Delta^2 + 495*\Delta^4)$ |
| Bit 12 | 7 | 6 | $1/4096 * (-6*\Delta^2 + 15*\Delta^4)$ |
|  | 8 | 5 | $1/4096 * (-2*\Delta^2 - 5*\Delta^4)$ |
|  | 9 | 4 | $1/4096 * (6*\Delta^2 - 29*\Delta^4)$ |
|  | 10 | 3 | $1/4096 * (18*\Delta^2 - 25*\Delta^4)$ |
|  | 11 | 2 | $1/4096 * (34*\Delta^2 + 55*\Delta^4)$ |
|  | 12 | 1 | $1/4096 * (54*\Delta^2 + 275*\Delta^4)$ |
|  | 13 | 0 | $1/4096 * (78*\Delta^2 + 715*\Delta^4)$ |
| Bit 13 | 7 | 7 | $1/8192 * (-7*\Delta^2 + 21*\Delta^4)$ |
|  | 8 | 6 | $1/8192 * (-5*\Delta^2 + 9*\Delta^4)$ |
|  | 9 | 5 | $1/8192 * (\Delta^2 - 19*\Delta^4)$ |
|  | 10 | 4 | $1/8192 * (11*\Delta^2 - 39*\Delta^4)$ |
|  | 11 | 3 | $1/8192 * (25*\Delta^2 - 11*\Delta^4)$ |
|  | 12 | 2 | $1/8192 * (43*\Delta^2 + 121*\Delta^4)$ |
|  | 13 | 1 | $1/8192 * (65*\Delta^2 + 429*\Delta^4)$ |
|  | 14 | 0 | $1/8192 * (91*\Delta^2 + 1001*\Delta^4)$ |

*Fig. 6*

HIGHLY ACCURATE SWITCHED CAPACITOR DAC

BACKGROUND OF THE INVENTION

1. Field of the Invention

This invention relates generally to the field of analog circuit design and, more particularly, to Digital to Analog Converter (DAC) design.

2. Description of the Related Art

Analog-to-digital converters (ADCs) are circuits used to convert signals from the analog domain, where the signals are typically represented by continuous quantities such as voltage and current, to the digital domain, where the signals are generally represented by discrete quantities such as numbers. Similarly, Digital-to-Analog converters (DACs) are circuits used to convert signals from the digital domain to the analog domain. These circuits can be implemented in a variety of ways. Well known and often used conversion techniques include flash, delta-sigma (or sigma-delta), sub-ranging, successive approximation, and integrating.

One often-utilized basic building block of an ADC is the analog integrator, commonly implemented as a switched-capacitor integrator (SCI) 100 illustrated in FIG. 1. Operation of SCI 100 consists of two main phases, the sampling phase and the charge transfer, or integration phase. During the sampling phase an input voltage $v_i$ 110 is coupled to a first terminal of input capacitor $C_{inp}$ 104 through switch P1 120, while switch P2 122 couples the second terminal of $C_{inp}$ 104 to ground. Thus $C_{inp}$ 104 is charged to a voltage level corresponding to $v_i$ 110. During the integration phase, P1 120 is used to couple the first terminal of $C_{inp}$ 104 to ground, while P2 122 is switched to couple the second terminal of $C_{inp}$ 104 to the inverting input terminal of operational amplifier (OP-AMP) 102, and to integration capacitor $C_{int}$ 106. $C_{int}$ 106 is connected to form a feedback loop between the inverting input and output terminal of OP-AMP 102. Thus, during the integration phase the charge stored across $C_{inp}$ 104 is transferred to $C_{inp}$ 106. The ratio $C_{inp}/C_{int}$ determines the gain of $v_o$ 112 with respect to $v_i$ 110.

One example of an ADC (and DAC) is the "delta-sigma converter" or "sigma-delta converter", which is well known in the art. Use of Delta-sigma (D/S) converters has proliferated due primarily to their capability for high-resolution analog-to-digital conversion in mixed signal VLSI processors. A D/S converter typically digitizes an analog signal at a very high sampling rate (multiple oversampling) in order to perform noise shaping. Digital filtering following the noise shaping allows the D/S converter to achieve a higher resolution than conventional ADCs. Decimation after the filtering reduces the effective sampling rate to the "Nyquist" rate.

FIG. 2 illustrates a block diagram of a single bit D/S converter 10, commonly known in the art. Single bit D/S converter 10 includes a single bit D/S modulator 12 coupled to a digital filter and decimation circuit 14. D/S modulator 12 includes a summing node 16, an integrator 18, a single bit ADC 20, and a single bit DAC 22. DAC 22 is coupled to the output of ADC 20 and provides feedback to summing node 16. An analog input signal Vin is connected to one input (add) of summing node 16, and the output of DAC 22 is connected to another input (subtract) of summing node 16. In operation, the output of summing node 16 is integrated by integrator 18 and subsequently converted into a single bit, digital signal by ADC 20. The single bit digital signal is in turn converted back to an analog signal by DAC 22 and subtracted from analog input signal Vin at summing node 16. Single bit D/S modulator 12 converts Vin into a continuous serial stream of 1s and 0s at a rate determined by a sampling clock frequency, $kf_s$. Due to the feedback provided by DAC 22, the average value output by DAC 22 approaches that of Vin when the gain of the loop is high enough.

FIG. 3 shows a block diagram of a multi-bit D/S converter 50. Multi-bit D/S converter 50 includes a multi-bit D/S modulator 52 coupled to a multi-bit digital filter and decimation circuit 54. Multi-bit D/S modulator 52 further includes a summing node 56, an integrator 58, a multi-bit ADC 60, and a multi-bit internal DAC 62. Multi-bit D/S modulator 50 of FIG. 3 operates similarly to the single-bit D/S converter of FIG. 2. The output of summing node 56 is integrated by integrator 58 and converted into a multi-bit digital signal by multi-bit internal ADC 60 operating at oversampling rate $kf_s$. Multi-bit DAC 62 is connected via a feedback loop between the output of the multi-bit ADC 60 and an input node of the summing node 56, whereby the analog signal output of DAC 62 is subtracted from analog signal input Vin. Again, the output of DAC 62 approaches that of analog input signal Vin as a result of the feedback. Digital filter and decimation circuit 54 removes quantization noise shaped into the higher frequencies and re-samples the over-sampled digital signal at rate $f_s$.

Multi-bit D/S converter 50 of FIG. 3 provides benefits over single bit D/S converter 10 of FIG. 2. Namely, the multi-bit D/S converter 50 provides more resolution and less quantization noise for a given oversampling rate. Additionally, multi-bit D/S converter 50 is more stable than single bit D/S converters. However, multi-bit D/S converter 50 suffers from linearity errors introduced by internal multi-bit DAC 62. Single bit D/S converters on the other hand do not produce linearity errors. Linearity error is due to the inability of the multi-bit DAC to accurately translate a digital input value into an analog current or voltage. In other words, given a particular digital input, the resulting analog output of multi-bit internal DAC 62 approximates the digital value but does not exactly equal the digital value. In reality, the actual analog output differs from the digital input value by an amount equal to the linearity error.

Another type of ADC is the successive approximation register (SAR) converter illustrated in FIG. 4. The conversion technique used by a SAR converter is also referred to as bit-weighing conversion, where typically a comparator 72 is used to compare the applied analog input voltage Vin 80 against the output of an N-bit DAC 76. Using the DAC 76 output as a reference, the final converted (digital) result Dout 86 is approached as a sum of N weighting steps, in which each step corresponds to a single-bit conversion. At the beginning of the conversion process the SAR 74 bits are all initialized to zero. The most significant bit (MSB) of SAR 74 is then set to '1' (or high) and the voltage as represented by SAR 74 (and produced by DAC 76) is compared with Vin 80. A Vin 80 value lower than the voltage represented by SAR 74 would imply that SAR 74 holds too large a value, which has to be reduced, in which case the MSB of SAR 74 is reset to zero. On the other hand, a Vin 80 value higher than the voltage represented by SAR 74 would imply that the register value is not large enough to equal Vin 80, in which case the MSB of SAR 74 is allowed to retain its value of '1'. In the next cycle, the next significant bit of SAR 74 is set to '1' and the same process is performed iteratively. As each bit is determined, it is latched into SAR 74 as part of the ADC's output. Typically controlled by a logic control circuit 78 which is operated synchronously through the use of clock signal 82, the aforementioned steps are executed N times for an N-bit ADC, at the end of which the contents of SAR 74 will correspond to the analog input voltage Vin 80 provided to the ADC. The beginning and end of the conversion process may be determined through a set of appropriate control signals.

Generally, single-bit DACs do not exhibit the non-linearity characteristics of multi-bit DACs. Accordingly, ADCs employing a single bit internal DAC do not suffer from linearity errors, and are therefore more accurate. In this respect, single bit internal DACs are preferred over multi-bit internal DACs. However, when utilizing the D/S technique, due to the resolution and stability of a multi-bit D/S converter being superior to that of a single bit D/S converter, it is preferable to use multi-bit D/S converters, where increased accuracy is achieved by removing or reducing the non-linearity produced by the D/S converter's internal multi-bit DAC. Similarly, while SAR converters generally operate at fast speeds and typically feature lower complexity and low power consumption, they are also directly affected by the accuracy of their internal DAC.

One technique used for increasing DAC accuracy has been Dynamic Element Matching (DEM), which cycles through a multiplicity of unit capacitors used in the DAC to cancel out mismatch errors. This technique typically requires a large silicon area because a unit capacitor is needed for each least significant bit (LSB) of the DAC. For example, a five-bit DAC would require 31 separate unit capacitors. Similarly, a 16-bit audio DAC would typically require ~65 k unit capacitors. To make an accurate audio DAC, a Delta Sigma architecture is generally used with a multi-bit quantizer using the aforementioned DEM technique.

In other words, one drawback of the DEM technique is that its use is typically restricted to low bit DACs since it requires a unit capacitor for each LSB of the DAC. Present day audio DACs are generally designed using the D/S technique. Though systems with resolutions of up to 24-bits have apparently been achieved using this technique, the linearity of such systems is difficult to verify. The drawback of D/S based design lies in the complexity of the DEM technique itself and the complex analog output filter it typically requires. Previously, capacitor DAC accuracy has been limited to the physical matching obtainable on silicon, which is approximately 0.1% (11 bits).

One proposed solution to the DAC accuracy problem has been the use of a technique of charge redistribution first introduced by Suarez et al in the IEEE publication "All-MOS Charge Redistribution Analog-to-Digital Conversion Techniques—Part II", IEEE Journal of Solid State Circuits, Vol. SC-10, No. 6, December 1975. The technique involves the use of two small capacitors and some switches to juggle a charge between the two capacitors to form the final DAC voltage. A significant limitation of this technique lies in its susceptibility to a mismatch error between the two capacitors. It also requires more clock cycles to convert the digital word into an analog voltage than other available techniques.

Therefore, there still exists a need for a system and method for designing highly accurate, low power, compact size DACs.

SUMMARY OF THE INVENTION

In one set of embodiments the invention comprises a system and method for designing and operating a highly accurate, low-power, compact size DAC. The charge redistribution technique first introduced by Suarez et al in the IEEE publication "All-MOS Charge Redistribution Analog-to-Digital Conversion Techniques—Part II", IEEE Journal of Solid State Circuits, Vol. SC-10, No. 6, December 1975, may be employed, where charge redistribution may be performed a first time and again a second time in a complementary fashion, followed by a summing of the two charge distributions, in effect canceling the odd order capacitor mismatch errors. In other words, two complementary conversions may be performed and added together to form a final DAC output voltage. The two complementary conversions, when added, may cancel all odd order mismatch errors such that the accuracy of the DAC may become a function of the square of the mismatch of the two capacitors, resulting in greatly increased accuracy. When performing the complementary conversions for multiple bits, the sequence in which each of the two capacitors is charged may be determined to minimize the even-order errors, especially second-order errors. The invention also proposes applying the DEM technique in conjunction with the complementary conversions, thus substantially reducing even-order errors in addition to eliminating odd-order errors, with less oversampling than required by current DEM implementations.

Without the proposed canceling, capacitors matched to 0.1% would allow for a resolution of 11 bits, while applying the proposed technique may result in capacitors matched to 0.1% allowing for resolutions of up to twenty-two bits. Integrating the DEM technique with the complementary conversion technique makes it possible to eliminate first, second, and third order errors of a DAC operating with eight times oversampling for up to six bits. D/S multi-bit quantizers may typically use DACs with resolution of less than or equal to six bits. This implies that an accuracy of forty-four bits may be possible with capacitors matching to 0.1%, and any error contributed by capacitor mismatch may be eliminated, though final DAC accuracy will be limited by other error sources in the DAC. The performance of D/S DACs and ADCs may thus also be greatly improved.

BRIEF DESCRIPTION OF THE DRAWINGS

The foregoing, as well as other objects, features, and advantages of this invention may be more completely understood by reference to the following detailed description when read together with the accompanying drawings in which:

FIG. 6 illustrates a table of error-terms calculated for each bit of a 13-bit binary number to be converted in accordance with one set of embodiments of the present invention.

Figure 1:
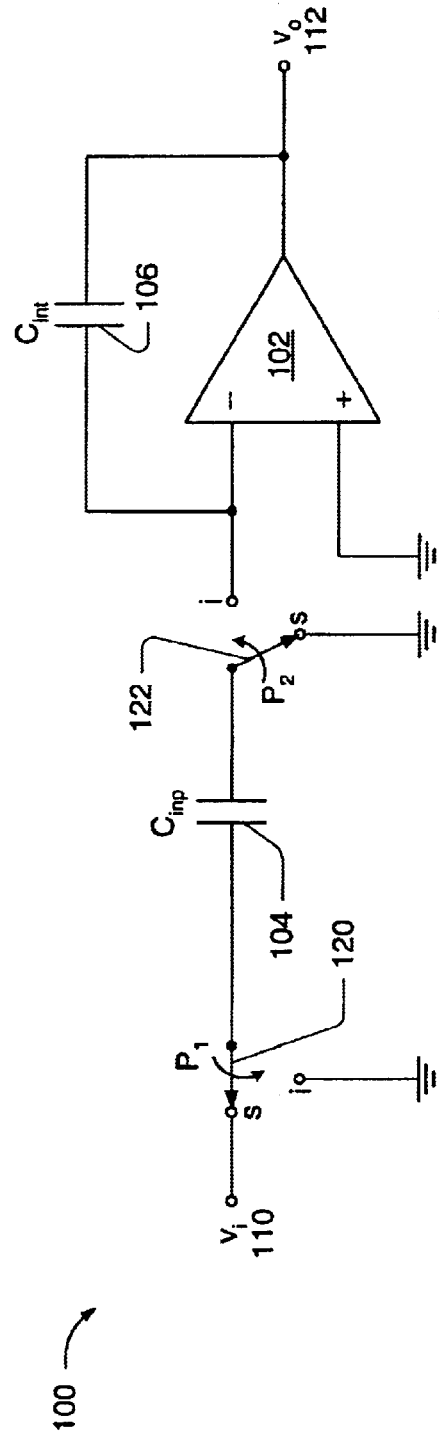
FIG. 1 illustrates a switched-capacitor integrator in accordance with prior art.
Figure 2:
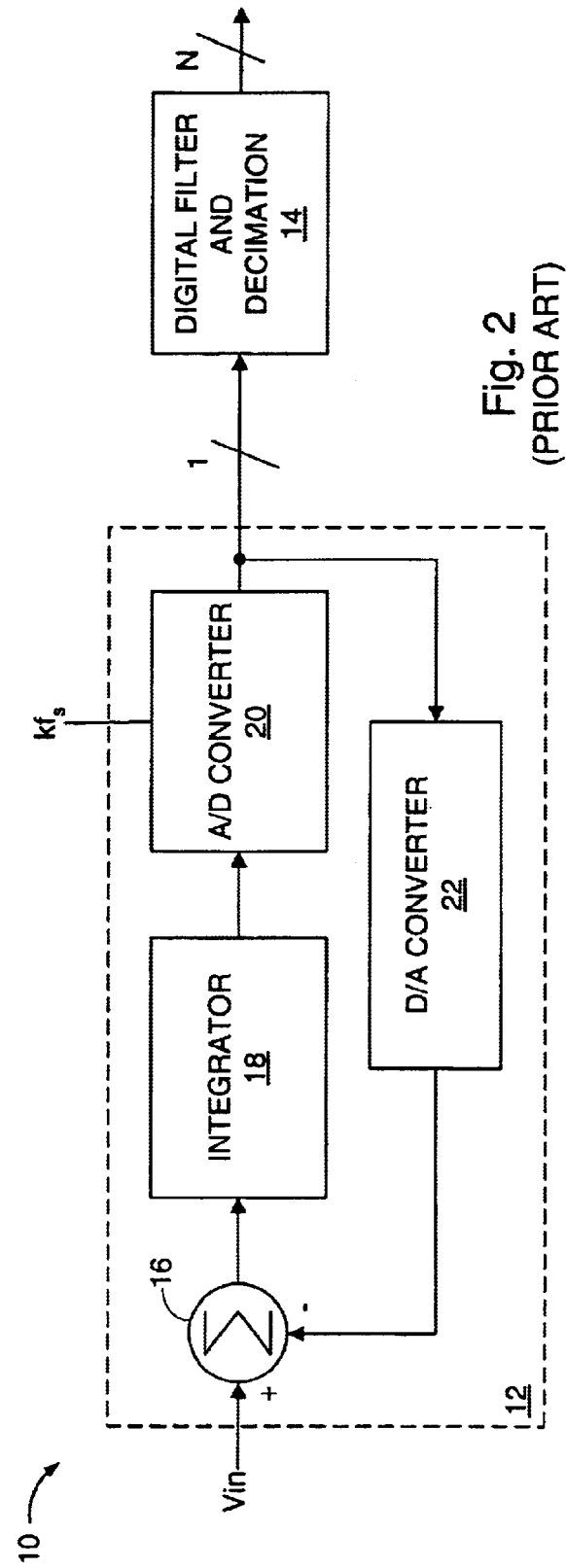
FIG. 2 illustrates a schematic diagram of one embodiment of a single bit D/S converter in accordance with prior art.
Figure 3:
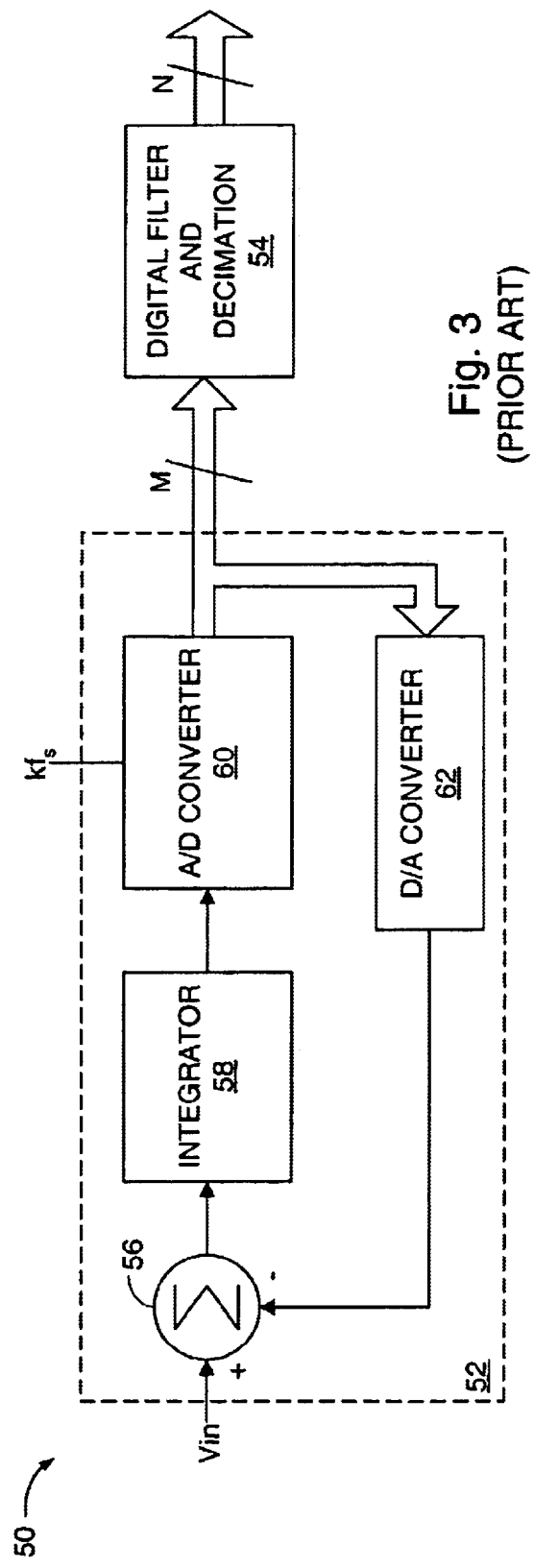
FIG. 3 illustrates a block diagram of one embodiment of a multi-bit D/S converter in accordance with prior art.
Figure 4:
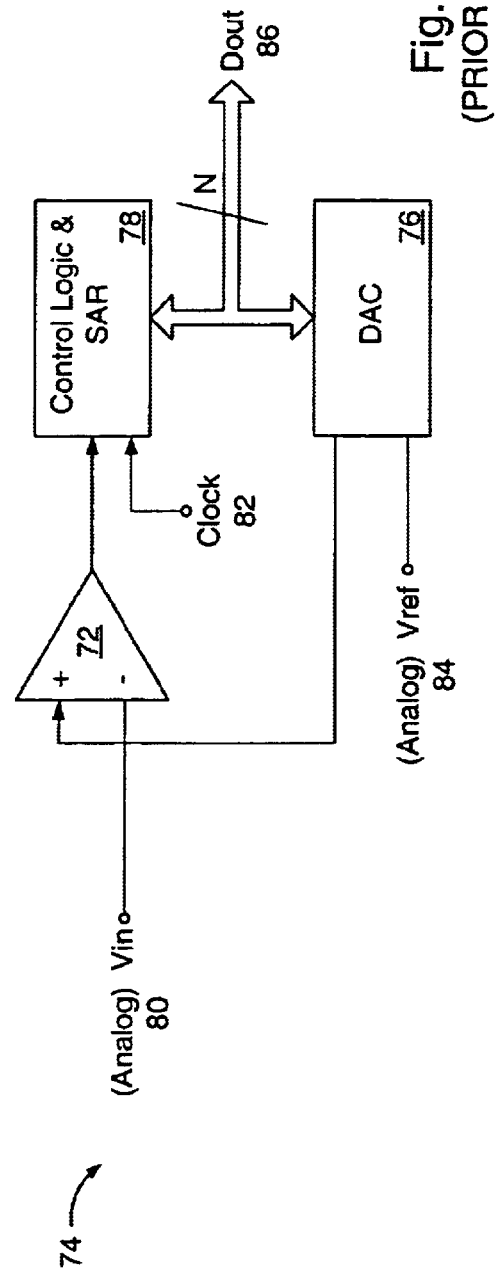
FIG. 4 illustrates a block diagram of a successive approximation register converter in accordance with prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

As used herein, when referencing a pulse of a signal, a "leading edge" of the pulse is a first edge of the pulse, resulting from the value of the signal changing from a default value, and a "trailing edge" is a second edge of the pulse, resulting from the value of the signal returning to the default value. A first signal is said to be "corresponding" to a second signal if the first signal was generated in response to the second signal. When data is said to be "registered" or "latched" "using" a signal, the signal acts as a trigger signal that controls the storing of the data into the register or latch. In other words, when a signal "used" for registering or latching data is in its triggering state, the data residing at respective input ports of the register or latch is stored into the register or latch. Similarly, when data is latched "on the leading edge" or "on the trailing edge" of a pulse of a clock, the data residing at respective input ports of a register or latch is stored into the register or latch, respectively, when a leading edge or a trailing edge of a pulse of the clock occurs, respectively. A first signal is said to "propagated based on" a second signal, when the second signal controls the propagation of the first signal. Similarly, a first module is said to "use" a clock signal to transfer data to a second module, when propagation of the data from the first module to the second module is controlled and/or triggered by the clock signal. When referencing a binary number, the least significant bit (LSB) is understood to be the rightmost bit of the binary number, whereas the most significant bit (MSB) is understood to be the leftmost bit of the binary number. For example, in case of the binary number '011' the LSB would be '1' while the MSB would be '0'.

Figure 5:
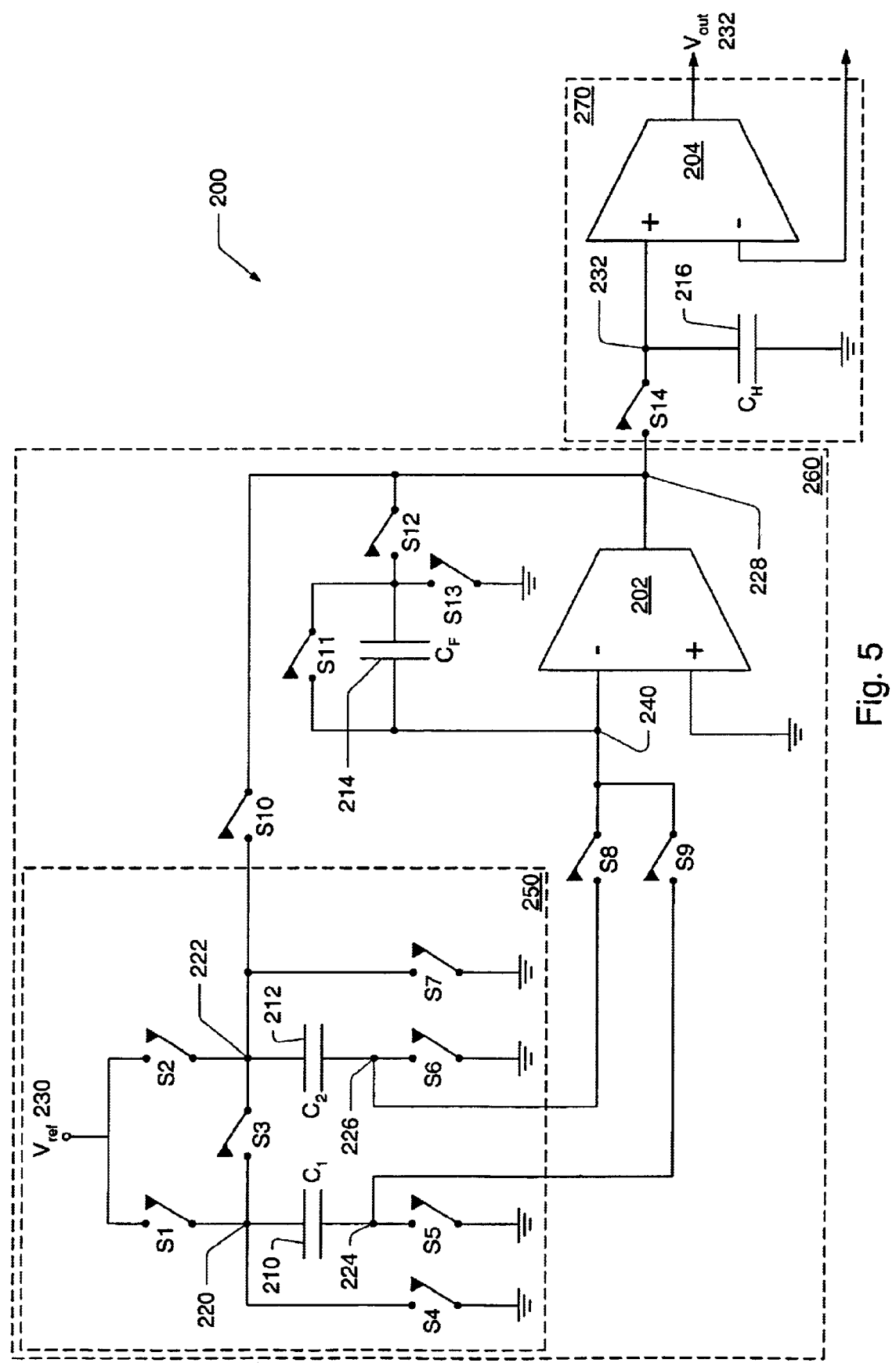
FIG. 5 illustrates a schematic diagram of one embodiment of a DAC in accordance with the present invention.

FIG. 5 shows the schematic of a DAC built around a switched-capacitor integrator (SCI), operated in accordance with one set of embodiments of the present invention. In this embodiment, DAC 200 includes a charge redistribution circuit (CRC) 250 functionally configured and coupled as an input capacitor-unit of an SCI 260, which is coupled to a hold/output circuit 270. CRC 250 may include capacitors $C_1$ 210 and $C_2$ 212 coupled in parallel. Through node 220, one terminal of $C_1$ 210 may be coupled to a reference voltage $V_{ref}$ 230 via switch S1, coupled to a common ground via switch S4, and coupled to node 222 via switch S3. The other terminal of $C_1$ 210 may be coupled to the common ground via switch S5. Similarly, through node 222, one terminal of $C_2$ 212 may be coupled to $V_{ref}$ 230 via switch S2 and to the common ground via switch S7. The other terminal of $C_2$ 212 may be coupled to the common ground via switch S6.

In one set of embodiments, capacitor $C_1$ 210 may be selected to have substantially the same capacitance value as capacitor $C_2$ 212. However, for example, due to process variation during fabrication a mismatch may exist between the values of $C_1$ 210 and $C_2$ 212. If C is the average value of $C_1$ 210 and $C_2$ 212, and $\Delta$ is defined as one-half of the difference between $C_1$ 210 and $C_2$ 212, then $C_1$ 210 and $C_2$ 212 may be expressed as:

$$C_1 = C + \Delta C = C^*(1+\Delta) \quad (1)$$

$$C_2 = C - \Delta C = C^*(1-\Delta) \quad (2)$$

$$C_1 + C_2 = C + \Delta C + C - \Delta C = 2^*C \quad (3)$$

For example, if the value of $C_1$ 210 matches the value of $C_2$ 212 by 1%, then:

$$\Delta = \tfrac{1}{2} * 0.01 = 0.005 \quad (4)$$

The DAC configured in FIG. 5 may be operated such that odd-order errors introduced by $C_1$ 210 matching $C_2$ 212 within 1% (i.e. $C_1$ 210 not matching $C_2$ 212 perfectly) are eliminated. The DAC configured in FIG. 5 may also be operated such that even-order errors are minimized.

Referring to FIG. 5, holding switches S8, S9, and S10 of SCI 260 open, calculating (converting) a single bit may be performed by first charging $C_1$ 210 to $V_{ref}$ 230 (resulting in $C_1$ 210 holding a charge $Q_1$), and shorting $C_2$ 212 to ground (resulting in $C_2$ 212 not holding any charge) by closing switches S1, S5, S6, and S7, and keeping switches S2, S3, and S4 open. Subsequently, closing switch S3 and opening switches S1, and S7 would result in $Q_1$ now being shared between $C_1$ 210 and $C_2$ 212, leading to $C_1$ 210 holding a nominal charge $Q_1/2$, and $C_2$ 212 holding a nominal charge $Q_1/2$. The charge held by $C_1$ 210 may be expressed as:

$$\frac{V_{ref} C_1^2}{C_1 + C_2}, \quad (5)$$

and the charge held by $C_2$ 212 may be expressed as:

$$\frac{V_{ref} C_1 C_2}{C_1 + C_2}. \quad (6)$$

Selecting integrator feedback capacitor (CF) 214 to have a capacitance value substantially equal to the combined capacitance value of $C_1$ 210 and $C_2$ 212, (in other words, to the overall capacitance value observed between nodes 220 and 224 with switches S3, S8 and S9 closed with all other switches held open, resulting from capacitor $C_1$ 210 and $C_2$ 212 being coupled in parallel) and transferring the charge $Q_1/2$ from $C_1$ 210 to $C_F$ 214 by opening switches S3, S5, S6, S11 and S13, and closing switches S4, S9 and S12, the following output voltage may be obtained at node 228:

$$V_{out} = \frac{V_{ref} C_1^2}{(C_1 + C_2) * C_F}. \quad (7a)$$

At this point, $C_F$ 214 and $C_1 + C_2$ (the combined capacitance of $C_1$ 210 coupled in parallel with $C_2$ 212) may be "flipped", that is the charge held by $C_F$ 214 may be re-dumped onto $C_1$ 210 and $C_2$ 212. This re-dumping of the charge may eliminate a need to match $C_F$ 214 to the combination capacitance of $C_1 + C_2$, and the output voltage obtained at node 228 may be expressed as:

$$V_{out} = \frac{V_{ref} C_1^2}{(C_1 + C_2)^2}. \quad (7b)$$

It should be noted that for purposes of clarity and simplicity, when referencing the output voltage at node 228 henceforth, a re-dumping of the charges from $C_F$ 214 to $C_1$ 210 and $C_2$ 212 as described above will be assumed, unless otherwise noted, to preferably express the output voltage at node 228 using equation (7b). Substituting into equation (7b) the values for $C_1$ and $C_2$ from equations (1) and (2), we may obtain:

$$V_{out} = V_{ref} \frac{C^2(1+\Delta)^2}{(C+\Delta C+C-\Delta C)} = V_{ref} \frac{C^2(1+2\Delta+\Delta^2)}{(2C)^2} \qquad (8)$$

$$= V_{ref} \frac{1+2\Delta+\Delta^2}{4}.$$

Again referring to FIG. 5, while holding switches S8, S9, and S10 of SCI 260 open, $C_2$ 212 may be charged to $V_{ref}$ 230 (resulting in $C_2$ 212 holding a charge $Q_2$), and $C_1$ 210 may be shorted to ground (resulting in $C_1$ 210 not holding any charge) by closing switches S2, S4, S5, and S6, and keeping switches S1, S3, and S7 open. Subsequently, closing switch S3 and opening switches S2, and S4 would result in $Q_2$ now being shared between $C_1$ 210 and $C_2$ 212, leading to $C_1$ 210 holding a nominal charge $Q_2/2$, and $C_2$ 212 holding a nominal charge $Q_2/2$. The charge held by $C_1$ 210 may be expressed as:

$$\frac{V_{ref}C_1C_2}{C_1+C_2}, \qquad (9a)$$

and the charge held by $C_2$ 212 may be expressed as:

$$\frac{V_{ref}C_2^2}{C_1+C_2}. \qquad (9b)$$

Charge $Q_2/2$ from $C_2$ 212 is transferred to $C_F$ 214 by opening switches S3, S5, S6, S11 and S13, and closing switches S7, S8 and S12, the following output voltage may be obtained at node 228:

$$V_{out} = V_{ref} \frac{C^2(1-\Delta)^2}{(C+\Delta C+C-\Delta C)} = V_{ref} \frac{C^2(1-2\Delta+\Delta^2)}{(2C)^2} \qquad (9c)$$

$$= V_{ref} \frac{1-2\Delta+\Delta^2}{4}.$$

The results of equations (8) and (9c) may be added and the resulting value of Vout is:

$$V_{out} = V_{ref} \frac{1+2\Delta+\Delta^2}{4} + V_{ref} \frac{1-2\Delta+\Delta^2}{4} = V_{ref} \frac{1+\Delta^2}{2}. \qquad (9d)$$

Thus, final accuracy of the above bit may be represented by the term $1+\Delta^2$, which, for example, in case of a 0.1% matching of $C_1$ 210 to $C_2$ 212, yields $(1-0.0005^2)=0.99999975$. In other words, using the charge distribution technique as described above, for capacitors $C_1$ 210 and $C_2$ 212 matching to 0.1%, the error introduced by the mismatch may be no more than 0.000025% contrasted with an error of 0.1% without using the charge distribution technique. Furthermore, the process described above may be extended to multiple bits.

Conversion of a multiple-bit number may be accomplished by operating the DAC in FIG. 5 as follows. For purposes of illustration the binary number '101' will be used, but it should be understood that any number comprised of any number of bits might be converted by following the method described herein.

As a default, each switch (S1 through S14) may be left in an open position unless otherwise specified. First, when converting the LSB '1', $C_1$ 210 may be charged to $V_{ref}$ by closing switches S1 and S5, and $C_2$ 212 may be shorted to ground by closing switches S6 and S7. Subsequently, switches S1 and S7 may be re-opened and switches S5 and S6 may remain closed. By then closing switch S3, the previously stored charge on $C_1$ 210 would now be shared between $C_1$ 210 and $C_2$ 212. In other words, the value of the respective nominal voltage across both $C_1$ 210 and $C_2$ 212 would now be $V_{ref}/2$ if the value of $C_1$ 210 were exactly matched to the value of $C_2$ 212. The switching method described herein seeks to correct the error that may be introduced by a mismatch present between $C_1$ 210 and $C_2$ 212 due, for example, to process variation during fabrication.

Switch S3 may now be opened in order to convert the next significant bit of the binary number. A determination may be made whether to charge $C_1$ 210 or $C_2$ 212. While, at this point, a choice of which capacitor ($C_1$ 210 or $C_2$ 212) to charge may not have a direct effect on the elimination of odd-order errors, it may be significant when considering the minimization, or possible elimination, of even-order errors. A method for such selection to minimize even-order errors will be further described below. In this example $C_2$ 212 may be selected as the next capacitor to receive a new charge. Therefore, in the instance of a bit value of '0' the current charge on $C_1$ 210 may be retained by keeping switch S1 and S4 open and switch S5 remaining closed, and $C_2$ 212 may be discharged by closing switch S7 (note that switch S6 remains closed). Now opening switch S7 and closing switch S3 the charge currently residing on $C_1$ 210 (corresponding to a voltage of $V_{ref}/2$ across $C_1$ 210) would be shared between $C_1$ 210 and $C_2$ 212. As a result, the value of the respective nominal voltage across both $C_1$ 210 and $C_2$ 212 would be $V_{ref}/4$.

For the following bit value of '1', $C_2$ 212 may be selected and charged to $V_{ref}$ by opening switches S3 and S7, and closing switches S2 (note that switch S6 remains closed). The current voltage of $V_{ref}/4$ may be preserved across $C_1$ 210 by also opening switches S1 and S4. Once again, by opening switch S2 and closing switch S3, the total charge would be distributed between $C_1$ 210 and $C_2$ 212, resulting in a nominal voltage value of $5/8*V_{ref}$ across both $C_1$ 210 and $C_2$ 212. The total charge may be transferred to integration capacitor $C_F$ 214 by first opening switches S5, S6, S11, and S13, closing switch S12, and closing either S8 and S7 or S9 and S4 depending on which capacitor, $C_1$ 210 or $C_2$ 212, is selected for the source from which to transfer the charge to $C_F$ 214.

Once the charge has been transferred to $C_F$ 214, switches S8 and S9 may be opened and the entire switching sequence for converting the binary number '101' may be repeated with a complementary selection of the capacitor to be charged for each respective bit of the binary number. For example, if during the original sequence $C_1$ 210 was selected to be charged when converting the LSB of '101', this time $C_2$ 212 may be selected, and so forth. If 'm+n' represents the number of bits in the binary number to be converted, an equation for the output voltage generated for each $N^{th}$ bit at node 228 may be expressed as:

$$V_{bit(N)} = V_{ref} * \frac{(C_1^n * C_2^m + C_1^m * C_2^n)}{(C_1+C_2)^{(n+m)}}, \qquad (10)$$

where 'm' and 'n' also represent the number of times a selected capacitor is charged/discharged through the first-pass and then the complementary pass, respectively. For example, in the term $(C_1^n*C_2^m)$, 'n' and 'm' also indicate that capacitor $C_1$ is charged 'n' times and capacitor $C_2$ is charged 'm' times, respectively, during the first-pass switching sequence. Similarly, in the adjoining term $(C_1^m*C_2^n)$, 'm' and 'n' indicate that capacitor $C_1$ is charged, in a complementary fashion, 'm' times and capacitor $C_2$ is charged 'n' times during the complementary switching sequence.

Once completed and the resulting charge transferred to $C_F$ 214, then $C_F$ 214 and $C_1+C_2$ (the combined capacitance of $C_1$ 210 coupled in parallel with $C_2$ 212) may be "flipped", that is the charge held by $C_F$ 214 may be re-dumped onto $C_1$ 210 and $C_2$ 212, and hence the corresponding output voltage at node 228 of OTA 202, will be free of all odd-order errors. As will be indicated further below, second-order errors (as well as other even-order errors) may be minimized, or in some cases eliminated, by selecting in a specific sequence the capacitors to be charged/discharged for each respective bit of the binary number to be converted.

The following equations represent a mathematical formulation of the charges appearing on $C_1$ 210 and $C_2$ 212, respectively, through applying a first-pass switching sequence followed by a corresponding complementary switching-sequence as described above. While, for purposes of illustration, the following analysis is performed for a four-bit binary number, those skilled in the art will appreciate that the analysis is in no way restricted to four-bit binary numbers and may be performed for a binary number of any length. Equations (11-1) through (11-8) and (12-1) through (12-8) represent the charges appearing on $C_1$ 210 and $C_2$ 212, respectively, corresponding to each respective step during the first-pass switching sequence. Similarly, equations (13-1) through (13-8) and (14-1) through (14-8) represent the charges appearing on $C_1$ 210 and $C_2$ 212, respectively, corresponding to each respective step during the complementary switching sequence. The index of a respective step is indicated by the second digit in the equation number—for example equation (11-3) specifies the charge on $C_1$ 210 at the end of step '3' of the first-pass switching sequence and equation (144) specifies the charge on $C_2$ 212 at the end of step '4' of the complementary switching sequence. During each odd-numbered step the respective capacitor is either charged to $V_{ref}$ 230 or holds its charge from the previous step, and during each even-numbered step the total charge is shared between $C_1$ 210 and $C_2$ 212.

In the following equations, bit(0), bit(1), bit(2) and bit(3) represent the respective individual bits of the four-bit binary number for which the analysis is being performed, (bit(0) being the LSB and bit(3) being the MSB), where each bit may have a value of either '1' or '0'. $C_1$ and $C_2$ may be defined as listed in equations (1) and (2), respectively, leading to the sum '$C_1+C_2$' being defined as listed in equation (3).

The charge on $C_1$ 210 at the end of each respective step during the first-pass switching sequence may be represented as follows:

$$V_{ref} * C_1 * bit(0) \tag{11-1}$$

$$V_{ref} * \left( \frac{C_1^2 * bit(0)}{(C_1+C_2)} \right) \tag{11-2}$$

$$V_{ref} * \left( \frac{C_1^2 * bit(0)}{(C_1+C_2)} \right) \tag{11-3}$$

$$V_{ref} * \left( \frac{C_1^3 * bit(0)}{(C_1+C_2)^2} + \frac{C_1 * C_2 * bit(1)}{(C_1+C_2)} \right) \tag{11-4}$$

$$V_{ref} * (C_1 * bit(2)) \tag{11-5}$$

$$V_{ref} * \left( \frac{C_1^3 * C_2 * bit(0)}{(C_1+C_2)^3} + \frac{C_1 * C_2^2 * bit(1)}{(C_1+C_2)^2} + \frac{C_1^2 * bit(2)}{(C_1+C_2)} \right) \tag{11-6}$$

$$V_{ref} * \left( \frac{C_1^3 * C_2 * bit(0)}{(C_1+C_2)^3} + \frac{C_1 * C_2^2 * bit(1)}{(C_1+C_2)^2} + \frac{C_1^2 * bit(2)}{(C_1+C_2)} \right) \tag{11-7}$$

$$V_{ref} * \left( \frac{C_1^4 * C_2 * bit(0)}{(C_1+C_2)^4} + \right. \tag{11-8}$$
$$\left. \frac{C_1^2 * C_2^2 * bit(1)}{(C_1+C_2)^3} + \frac{C_1^3 * bit(2)}{(C_1+C_2)^2} + \frac{C_1 * C_2 * bit(3)}{(C_1+C_2)} \right).$$

The charge on $C_2$ 212 at the end of each respective step during the first-pass switching sequence may be represented as follows:

$$0 \tag{12-1}$$

$$V_{ref} * \left( \frac{C_1 * C_2 * bit(0)}{(C_1+C_2)} \right) \tag{12-2}$$

$$V_{ref} * (C_2 * bit(1)) \tag{12-3}$$

$$V_{ref} * \left( \frac{C_1^2 * C_2 * bit(0)}{(C_1+C_2)^2} + \frac{C_2^2 * bit(1)}{(C_1+C_2)} \right) \tag{12-4}$$

$$V_{ref} * \frac{C_1^2 * C_2 * bit(0)}{(C_1+C_2)^2} + \frac{C_2^2 * bit(1)}{(C_1+C_2)} \tag{12-5}$$

$$V_{ref} * \left( \frac{C_1^2 * C_2^2 * bit(0)}{(C_1+C_2)^3} + \frac{C_2^3 * bit(1)}{(C_1+C_2)^2} + \frac{C_1 * C_2 * bit(2)}{(C_1+C_2)} \right) \tag{12-6}$$

$$V_{ref} * (C_2 * bit(3)) \tag{12-7}$$

$$V_{ref} * \left( \frac{C_1^3 * C_2^2 * bit(0)}{(C_1+C_2)^4} + \right. \tag{12-8}$$
$$\left. \frac{C_1 * C_2^3 * bit(1)}{(C_1+C_2)^3} + \frac{C_1^2 * C_2 * bit(2)}{(C_1+C_2)^2} + \frac{C_2^2 * bit(3)}{(C_1+C_2)} \right).$$

The charge on $C_1$ 210 at the end of each respective step during the complementary switching sequence may be represented as follows:

$$0 \tag{13-1}$$

$$V_{ref} * \left( \frac{C_1 * C_2 * bit(0)}{(C_1+C_2)} \right) \tag{13-2}$$

$$V_{ref} * (C_1 * bit(1)) \tag{13-3}$$

$$V_{ref} * \left( \frac{C_1 * C_2^2 * bit(0)}{(C_1+C_2)^2} + \frac{C_1^2 * bit(1)}{(C_1+C_2)} \right) \tag{13-4}$$

$$V_{ref} * \frac{C_1 * C_2^2 * bit(0)}{(C_1+C_2)^2} + \frac{C_1^2 * bit(1)}{(C_1+C_2)} \tag{13-5}$$

$$V_{ref} * \left( \frac{C_1^2 * C_2^2 * bit(0)}{(C_1+C_2)^3} + \frac{C_1^3 * bit(1)}{(C_1+C_2)^2} + \frac{C_1 * C_2 * bit(2)}{(C_1+C_2)} \right) \tag{13-6}$$

$$V_{ref} * (C_1 * bit(3)) \tag{13-7}$$

$$V_{ref} * \left( \frac{C_1^2 * C_2^3 * bit(0)}{(C_1+C_2)^4} + \right. \tag{13-8}$$
$$\left. \frac{C_1^3 * C_2 * bit(1)}{(C_1+C_2)^3} + \frac{C_1 * C_2^2 * bit(2)}{(C_1+C_2)^2} + \frac{C_1^2 * bit(3)}{(C_1+C_2)} \right).$$

The charge on $C_2$ 212 at the end of each respective step during the complementary switching sequence may be represented as follows:

$$V_{ref} * C_2 * bit(0) \quad (14\text{-}1)$$

$$V_{ref} * \left( \frac{C_2^2 * bit(0)}{(C_1 + C_2)} \right) \quad (14\text{-}2)$$

$$V_{ref} * \left( \frac{C_2^2 * bit(0)}{(C_1 + C_2)} \right) \quad (14\text{-}3)$$

$$V_{ref} * \left( \frac{C_2^3 * bit(0)}{(C_1 + C_2)^2} + \frac{C_1 * C_2 * bit(1)}{(C_1 + C_2)} \right) \quad (14\text{-}4)$$

$$V_{ref} * (C_2 * bit(2)) \quad (14\text{-}5)$$

$$V_{ref} * \left( \frac{C_1 * C_2^3 * bit(0)}{(C_1 + C_2)^3} + \frac{C_1^2 * C_2 * bit(1)}{(C_1 + C_2)^2} + \frac{C_2^2 * bit(2)}{(C_1 + C_2)} \right) \quad (14\text{-}6)$$

$$V_{ref} * \left( \frac{C_1 * C_2^3 * bit(0)}{(C_1 + C_2)^3} + \frac{C_1^2 * C_2 * bit(1)}{(C_1 + C_2)^2} + \frac{C_2^2 * bit(2)}{(C_1 + C_2)} \right) \quad (14\text{-}7)$$

$$V_{ref} * \left( \frac{C_1 * C_2^4 * bit(0)}{(C_1 + C_2)^4} + \frac{C_1^2 * C_2^2 * bit(1)}{(C_1 + C_2)^3} + \frac{C_2^3 * bit(2)}{(C_1 + C_2)^2} + \frac{C_1 * C_2 * bit(3)}{(C_1 + C_2)} \right). \quad (14\text{-}8)$$

The output voltage at node 228 may then be represented in terms of the charge present on $C_2$ 212 at the end of the first-pass switching sequence, specified in equation (12-8) and labeled as $Q_2(fp)$, and the charge present on $C_1$ 210 at the end of the complementary switching sequence, specified in equation (13-8) and labeled as $Q_1(cp)$:

$$V_{out} = (Q_2(fp) + Q_1(cp)) * \frac{1}{(C_1 + C_2)}. \quad (15)$$

Substituting the values of $Q_2(fp)$ and $Q_1(cp)$ from equations (12-8) and (13-8), respectively, into equation (15), $V_{out}$ may be expressed as:

$$V_{out} = \quad (16)$$

$$V_{ref} * \left( \frac{(C_1^2 * C_2^2 + C_1^3 * C_2^3) * bit(0)}{(C_1 + C_2)^5} + \frac{(C_1^3 * C_2 + C_1 * C_2^3) * bit(1)}{(C_1 + C_2)^4} + \right.$$

$$\left. \frac{(C_1 * C_2^2 + C_1^2 * C_2) * bit(2)}{(C_1 + C_2)^3} + \frac{(C_1^2 + C_2^2) * bit(3)}{(C_1 + C_2)^3} \right).$$

Substituting the values of $C_1$ 210 and $C_2$ 212 as defined in equations (1) and (2), respectively, into equation (16), $V_{out}$ may be re-written as:

$$V_{out} = V_{ref} * \left( \frac{2 * C^3 * (1 - 2 * \Delta^2) * bit(0)}{(2 * C)^5} + \frac{2 * C^4 * (1 - \Delta^4) * bit(1)}{(2 * C)^4} + \right. \quad (17)$$

$$\left. \frac{2 * C^3 * (1 - \Delta^2) * bit(2)}{(2 * C)^3} + \frac{2 * C^2 * (1 + \Delta^2) * bit(3)}{(2 * C)^2} \right),$$

and simplified as:

$$V_{out} = \quad (18)$$

$$V_{ref} * \left( bit(0) * \left( \frac{1}{16} - \frac{\Delta^2}{8} \right) + bit(1) * \left( \frac{1}{8} - \frac{\Delta^4}{8} \right) + bit(2) * \left( \frac{1}{4} - \frac{\Delta^2}{4} \right) + \right.$$

$$\left. bit(3) * \left( \frac{1}{2} + \frac{\Delta^2}{2} \right) \right).$$

The results expressed in equation (18) indicate an absence of odd-order errors with error terms of only second-order or above present. For a ±1% matching between capacitors $C_1$ 210 and $C_2$ 212, the accuracy of the bits may be expressed using A as defined in equation (4), resulting in:

$$\frac{\Delta^2}{2} = \frac{(\pm 0.005)^2}{2} = 0.0000125 * Fullscale, \quad (19)$$

which represents a greater than sixteen-bit accuracy.

For a ±0.1% matching between capacitors $C_1$ 210 and $C_2$ 212, we may write:

$$\Delta = \pm 0.0005 \quad (20)$$

and $$\frac{\Delta^2}{2} = \frac{(\pm 0.0005)^2}{2} = 0.000000125 * Fullscale, \quad (21)$$

which represents a greater than twenty-three-bit accuracy. For an eleven-bit DAC the output voltage at node 228 may then be expressed as:

$$V_{out} = V_{ref} * \left( bit(0) * \left( \frac{1}{2048} - \frac{\Delta^2}{512} \right) + bit(1) * \left( \frac{1}{1024} - \frac{5 * \Delta^4}{1024} \right) + \right. \quad (22)$$

$$bit(2) * \left( \frac{1}{512} - \frac{3 * \Delta^2}{512} \right) + bit(3) * \left( \frac{1}{256} + \frac{\Delta^2}{64} \right) +$$

$$V_{ref} * \left( bit(4) * \left( \frac{1}{128} - \frac{\Delta^4}{64} \right) + bit(5) * \left( \frac{1}{64} - \frac{3 * \Delta^2}{64} \right) + \right.$$

$$bit(6) * \left( \frac{1}{32} - \frac{\Delta^2}{32} \right) + bit(7) * \left( \frac{1}{16} - \frac{\Delta^2}{8} \right) \right) + V_{ref} *$$

$$\left( bit(8) * \left( \frac{1}{8} - \frac{\Delta^4}{8} \right) + bit(9) * \left( \frac{1}{4} - \frac{\Delta^2}{4} \right) + bit(10) * \left( \frac{1}{2} + \frac{\Delta^2}{2} \right) \right).$$

In one embodiment, operation of switches S1 through S14 in the DAC of FIG. 5 may require four clock pulses per bit to be converted. These clock pulses may be very fast as no amplifier settling may need to be taken into account, only the sharing of charge between $C_1$ 210 and $C_2$ 212, and the charging of $C_1$ 210 and $C_2$ 212 to reference voltage $V_{ref}$ 230, respectively. At the end of each pass (entire switching sequence for the entire binary number to be converted), the charge from either $C_1$ 210 or $C_2$ 212 may be dumped to $C_F$ 214. At the end of the complementary switching sequence $C_F$ 214 and $C_1+C_2$ ($C_1$ 210 in parallel with $C_2$ 212) may be "flipped" as previously described during discussion of equation (7b). That is, the summed first-pass/complementary-pass charges may be re-dumped from $C_F$ 214 onto $C_1$ 210 and $C_2$ 212. Following the re-dump, the resulting voltage at node 228 may be transferred to hold capacitor CH 216 where it may be held as long as desired. In one embodiment, seven more cycles are added to the total conversion time to account for the charge re-dump and transfer to $C_H$ 216, and autozeroing of amplifiers 202 and 204. In this embodiment, the conversion time for an N-bit binary number may be expressed as:

$$T_{conversion} = \frac{4*N+7}{F_s}, \quad (23)$$

where $F_s$ is the sampling clock frequency.

Referring now to equation (10), it is apparent that multiple combinations of 'm' and 'n' may be considered for the converting of each bit. Considering Δ as previously defined, the error terms associated with each combination of 'm' and 'n' for each bit may be calculated. Substituting the terms for $C_1$ and $C_2$ from equations (1) and (2), respectively, into equation (10), the voltage for an N bit may be expressed as:

$$V_{bit(N)} = V_{ref} * \left( \frac{(1+\Delta)^n (1-\Delta)^m + (1+\Delta)^m (1-\Delta)^n}{2^{n+m}} \right). \quad (24)$$

Each bit may be formed with different values of 'n' and 'm', where the bit number N corresponds to m+n−1. In this case, since the MSB is most affected by the mismatch between $C_1$ 210 and $C_2$ 212, the error terms may be calculated not in the order in which the bits are converted but in the order of the MSB to the LSB, with bit 1 designated as the MSB.

FIG. 6 shows a table that includes error terms calculated for bit 1 through bit 13, where bit 1 is the MSB, for all the pertinent combinations of 'm' and 'n'. Only errors up to the fourth-order term are shown, as the contribution of higher than fourth-order terms to the overall error may be substantially negligible. Although the error terms for any bit, or bits, subsequent to bit 13 are not presented in the table of FIG. 6, they may also be calculated, and error terms for any number of desired bits may be obtained from equation (24). When converting an N-bit number, each respective bit—from bit 1 to bit N—may be formed by performing the first-pass switching sequence and the complementary switching sequence for one pair of 'n' and 'm' values (m,n) for the respective bit. Selection of (m,n) for each subsequent bit may be selected such that either the value of 'm' or the value of 'n' changes by one from the previous bit. For example, when converting a 3-bit number, (m,n) may be (1,1) for bit 1, (2,1) for bit 2, and (2,2) for bit 3. The total error associated with the final voltage would be a sum of the three respective error terms associated with each (m,n) for each respective bit. In the case of the above cited example of the 3-bit number, the error would be:

$$Error = \frac{1}{2}*(-\Delta^2) + \frac{1}{4}*(-\Delta^2) + \frac{1}{8}*(-2*\Delta^2 + \Delta^4). \quad (25)$$

Error terms will only be incurred for bit values of '1'. In other words, as is evident from the sets of equations (11-1)–(11-8), (12-1)–(12-8), (13-1)–(13-8) and (14-1)–(14-8), for any bit value of '0', the respective voltage term, and hence error term, would be zero.

Considering the error terms as shown in FIG. 6, a path may be determined from each bit to the next, where the total accrued error may be minimized. Following a particular path in switching the charges, it is possible to have the second-order terms in the individual error terms shown in FIG. 6 to cancel, when a combination of paths are added together. In other words, a combination of paths may be identified and added together, such that the second-order error terms associated with each chosen path cancel each other when added together. Referring again to FIG. 6, when considering bit 1, if a first-pass/complementary pass switching sequence is performed four times, twice with (m,n) chosen as (1,1) and twice with (m,n) chosen as (2,0), the error (up to, but not including fourth-order and higher even-order error terms), corresponding to bit 1 adds up to:

$$Error_{bit1} = \frac{1}{2}*(\Delta^2) + \frac{1}{2}*(-\Delta^2) + \frac{1}{2}*(-\Delta^2) + \frac{1}{2}*(\Delta^2) = 0. \quad (26)$$

As can be observed in equation (26), there are no second-order error terms present in the final result. Similarly, if (m,n) combinations for bit 2 are selected to be (2,1) three times and (3,0) once, the error (up to, but not including fourth-order and higher even-order error terms), corresponding to bit 2 adds up to:

$$Error_{bit2} = 3*\frac{1}{4}*(-\Delta^2) + \frac{1}{4}*(3*\Delta^2) = 0. \quad (27)$$

Again, there are no second-order errors terms present in the final sum of equation (27).

Based on the above analysis, a combination of paths may be obtained for converting an N-bit binary number, where each combination of paths leads to a canceling, or minimizing, of second-order errors and/or higher even-order errors. Considering bit 1 and bit 2, and the first-pass/complementary switching sequences being performed four times, a selected path combination for bit 1 and bit 2 may include a first and second path that each include a (m,n) pair of (1,1) for bit 1 followed by a respective (m,n,) pair of (2,1) for bit 2, a third path that includes a (m,n) pair of (2,0) for bit 1 followed by a third (m,n) pair of (2,1) for bit 2, and finally, a fourth path that includes a second (m,n) pair of (2,0) for bit 1 followed by a (m,n) pair of (3,0) for bit 2. Since the selection of four paths for bit 1 and bit 2, respectively, coincide with the combinations set forth above leading to the results of equations (26) and (27), the second-order error terms will sum to zero for both bit 1 and bit 2, as previously indicated in equations (26) and (27), respectively. The selection of paths may be extended to subsequent bits following the same considerations.

Figure 7:
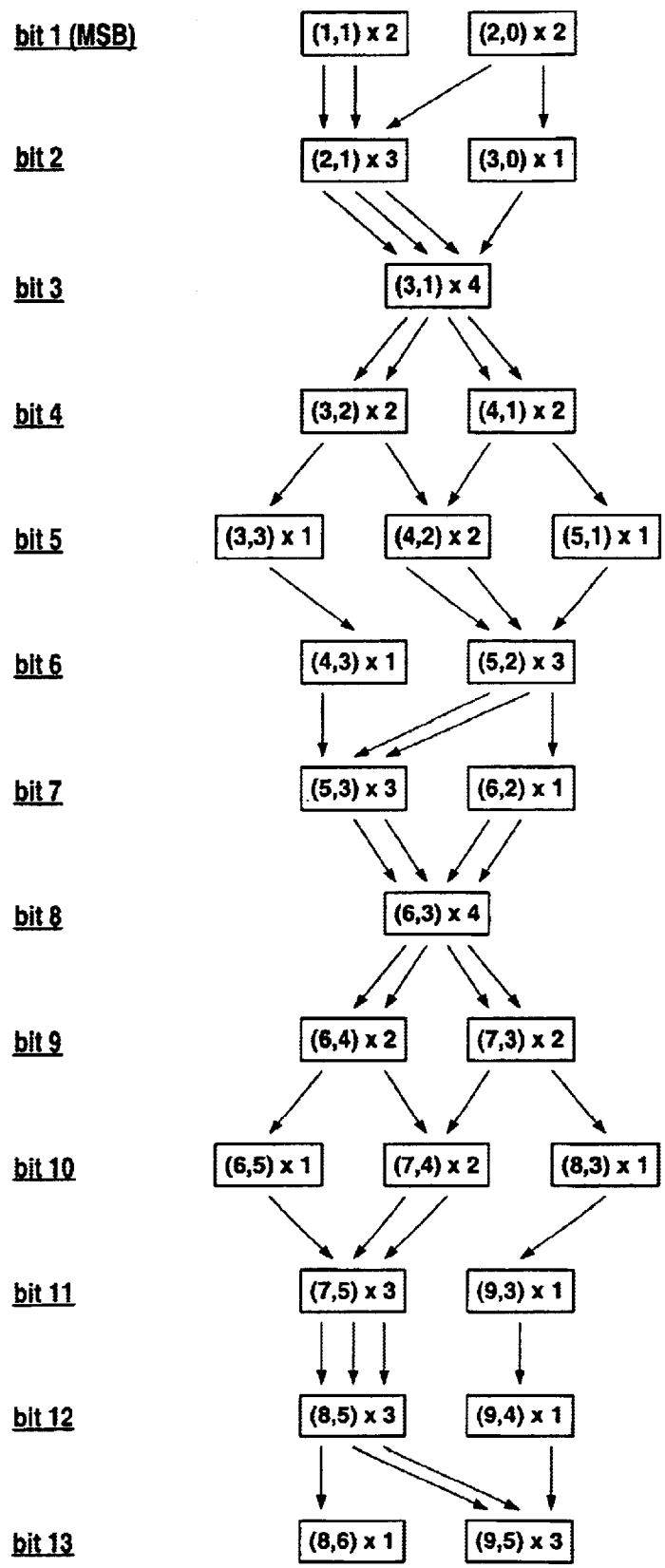
FIG. 7 illustrates a tree diagram of possible paths to select when performing four first-pass/complementary switching sequences while minimizing and/or eliminating second-order and higher even-order errors, in accordance with one set of embodiments of the present invention.

FIG. 7 shows a tree diagram outlining a possible arrangement of four path sequences when performing four combinations of switching in a manner that leads to the cancellation of second-order errors for as many bits as possible. Each box may contain a (m,n) path combination for the respective bit, and a multiplier indicating the number of times that path combination may be employed for the respective bit. While the diagram only extends the sequence to thirteen bits, it may be implemented for as many bits as desired, starting with the MSB at the top. As previously mentioned, the paths may start at the MSB due to errors associated with the MSB having the greatest effect on a final voltage value, where the final voltage value is the final result of the digital to analog conversion of the selected N-bit binary number. The errors associated with each bit may be calculated while traversing the paths as illustrated in FIG. 7. For each bit, the (m,n) pair(s) given in FIG. 7 may be cross-referenced to the respective error terms shown in FIG. 6, and added according to the multiplier as also indicated in FIG. 7. The errors for the first seven bits—after having performed all four combinations of first-pass/complementary switching sequences—are shown below, with the exception of bit 1 and bit 2, which are shown in equations (26) and (27).

$$Error_{bit3} = 4*\frac{1}{8}*(-\Delta^4) = -\frac{1}{2}*\Delta^4. \quad (28)$$

-continued $$Error_{bit4} = \qquad (29)$$
$$2*\frac{1}{16}*(-2*\Delta^2+\Delta^4)+2*\frac{1}{16}*(2*\Delta^2-3*\Delta^4)=-\frac{1}{4}*\Delta^4.$$

$$Error_{bit5} = \qquad (30)$$
$$\frac{1}{32}*((-3*\Delta^2+3*\Delta^4)+2*(-\Delta^2-\Delta^4)+(5*\Delta^2-5*\Delta^4))=$$
$$-\frac{1}{8}*\Delta^4.$$

$$Error_{bit6} = \frac{1}{64}*((-3*\Delta^2+3*\Delta^4)+3*(\Delta^2-5*\Delta^4))=-\frac{3}{16}*\Delta^4. \qquad (31)$$

$$Error_{bit7} = \qquad (32)$$
$$\frac{1}{128}*(3*(-2*\Delta^2)+(4*\Delta^2-10*\Delta^4))=-\frac{1}{64}*\Delta^2-\frac{5}{64}*\Delta^4.$$

As may be observed from equations (26) through (32), by using four combinations of first-pass/complementary switching, first, second, and third order errors may be canceled for up to six bits. Bit 7 does incur a second-order error term, as shown in equation (32). However, for $C_1$ 210 matching $C_2$ 212 within 1%, a matching percentage that may be obtained without substantial difficulties during fabrication, the second-order error shown in equation (32) may calculate to a value of 0.00000039, which represents −128 dB with respect to fullscale, and corresponds to approximately 21 bits of accuracy.

A six-bit (or less) DAC may be considered for a multi-bit quantizer in a delta-sigma ADC. A typical five-bit quantizer may require an accurate five-bit DAC. The linearity of a delta-sigma modulator may be no better than the linearity of its internal DAC, which may indicate that a best linearity obtainable with a standard switched-capacitor based DAC may be approximately ten bits, as the capacitors might not possibly be matched to obtain a better linearity. When utilizing DEM to alleviate this problem, thirty-two unit capacitors may be needed for a five-bit DAC, essentially leading to what may be considered thirty-two one-bit DACs. A method of switching for randomizing or noise shaping the DACs may be complex, and the amount of required oversampling may be constrained to be greater than the number of one-bit DACs employed. In such a case an oversampling ratio of at least 32 might be needed for a five-bit quantizer.

Thus, various embodiments of the systems and methods described above may facilitate design and operation of a DAC with eight times oversampling for up to six bits without first, second and third-order errors. An accuracy of forty-four bits may be possible with capacitors matching to 0.1%, and any error contributed by capacitor mismatch may be eliminated, greatly improving the performance of delta-sigma DACs and ADCs.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A digital to analog converter (DAC) comprising:
   a first capacitance and a second capacitance configured in a first switching circuit;
   wherein the first switching circuit is configured as an input capacitance of a switched capacitor integrator;
   wherein the first switching circuit is operable to redistribute charge stored on the first capacitance, to be shared substantially equally by the first capacitance and the second capacitance;
   wherein the first switching circuit is further operable to redistribute charge stored on the second capacitance, to be shared substantially equally by the first capacitance and the second capacitance;
   wherein applying a first-pass switching sequence to the first switching circuit for converting a binary number results in a first voltage across the first capacitance and across the second capacitance;
   wherein applying a complementary switching sequence corresponding to the first-pass switching sequence to the first switching circuit for converting the binary number results in a second voltage across the first capacitance and across the second capacitance;
   wherein, in applying the first-pass switching sequence, the first capacitance is charged to a conversion level a first number of times and the second capacitance is charged to the conversion level a second number of times;
   wherein in applying the complementary switching sequence, the first capacitance is charged to the conversion level the second number of times and the second capacitance is charged to the conversion level the first number of times;
   wherein, in applying the first-pass switching sequence, if the first capacitance is charged to the conversion level for a respective bit of the binary number then the second capacitance is not charged to the conversion level for the respective bit, and in applying the complementary switching sequence the first capacitance is not charged to the conversion level for the respective bit, but the second capacitance is;
   wherein, in applying the first-pass switching sequence, if the second capacitance is charged to the conversion level for the respective bit, then the first capacitance is not charged to the conversion level for the respective bit, and in applying the complementary switching sequence the second capacitance is not charged to the conversion level for the respective bit, but the first capacitance is;
   wherein the first-pass switching sequence and the corresponding complementary switching sequence form a conversion sequence for the binary number, wherein for each bit of the binary number, charge is redistributed between the first capacitance and the second capacitance;
   wherein an integrated sum of the first voltage and the second voltage comprises a DAC output voltage free of odd-order errors, wherein if the first voltage is obtained from the first capacitance then the second voltage is obtained from the second capacitance, and if the first voltage is obtained from the second capacitance then the second voltage is obtained from the first capacitance;
   wherein performing the conversion sequence a specified number of times and integrating the DAC output voltage at the end of each conversion sequence results in a final DAC output voltage;
   wherein the final DAC output voltage is free of odd-order capacitor mismatch errors; and
   wherein the final DAC output voltage is free of second-order capacitor mismatch errors for up to a specified number of bits.

2. The DAC of claim 1;
   wherein the switched capacitor integrator comprises a first operational transconductance amplifier (OTA); and wherein the first switching circuit is coupled to an inverting input of the first OTA.

3. The DAC of claim 1, further comprising a hold circuit coupled to an output of the switched capacitor integrator, wherein the hold circuit is operable to hold the final DAC output voltage.

4. The DAC of claim 3, wherein the hold circuit comprises:
   a second OTA; and
   a hold capacitor coupled to a non-inverting input of the second OTA;
   wherein the output of the switched capacitor integrator is coupled to the non-inverting input of the second OTA.

5. The DAC of claim 1, wherein a value of the first capacitance is substantially the same as a value of the second capacitance.

6. The DAC of claim 1;
   wherein if a bit value for the respective bit is 1, then the conversion level is a reference voltage; and
   wherein if the bit value for the respective bit is 0, then the conversion level is common ground.

7. A method for digital to analog conversion of a binary number, the method comprising:
   performing a conversion sequence a specified number of times, wherein the conversion sequence comprises:
      applying a first-pass switching sequence to a first switching circuit comprising a first capacitance and a second capacitance, resulting in a first voltage across the first capacitance and across the second capacitance;
      integrating the first voltage;
      applying a complementary switching sequence corresponding to the first-pass switching sequence to the first switching circuit, resulting in a second voltage across the first capacitance and across the second capacitance; and
      integrating the second voltage;
   wherein if during said integrating the first voltage, the first voltage is obtained from the first capacitance then during said integrating the second voltage, the second voltage is obtained from the second capacitance, and if during said integrating the first voltage, the first voltage is obtained from the second capacitance then during said integrating the second voltage, the second voltage is obtained from the first capacitance;
   wherein said applying the first-pass switching sequence comprises charging the first capacitance to a conversion level a first number of times and charging the second capacitance to the conversion level a second number of times;
   wherein said applying the complementary switching sequence comprises charging the first capacitance to the conversion level the second number of times and charging the second capacitance to the conversion level the first number of times;
   wherein, if charging the first capacitance in said applying the first-pass switching sequence is performed for a respective bit of the binary number, then charging the second capacitance in said applying the first-pass switching sequence is not performed for the respective bit, and charging the first capacitance in said applying the complementary switching sequence is not performed for the respective bit, but charging the second capacitance in said applying the complementary switching sequence is performed;
   wherein, if charging the second capacitance in said applying the first-pass switching sequence is performed for the respective bit, then charging the first capacitance in said applying the first-pass switching sequence is not performed for the respective bit, and charging the second capacitance in said applying the complementary switching sequence is not performed for the respective bit, but charging the first capacitance in said applying the complementary switching sequence is performed;
   wherein said applying the first-pass switching sequence and said applying the complementary switching sequence each comprise redistributing charge stored on the first capacitance and the second capacitance to be shared substantially equally between the first capacitance and the second capacitance for each bit of the binary number;
   wherein said performing the conversion sequence the specified number of times results in a final DAC output voltage;
   wherein the final DAC output voltage is free of odd-order capacitor mismatch errors; and
   wherein the final DAC output voltage is free of second-order capacitor mismatch errors for up to a specified number of bits.

8. The method of claim 7, wherein a value of the first capacitance is substantially the same as a value of the second capacitance.

9. The method of claim 7;
   wherein if a bit value for the respective bit is 1, then the conversion level is a reference voltage; and
   wherein if the bit value for the respective bit is 0, then the conversion level is common ground.

10. The method of claim 7;
    wherein the first number is different for each conversion sequence in said performing the conversion sequence a specified number of times; and
    wherein the second number is different for each conversion sequence in said performing the conversion sequence a specified number of times.

11. A method for operating a DAC for converting a binary number comprising one or more bits, wherein the DAC comprises a switched capacitor integrator and a first switching circuit comprising a first capacitor and a second capacitor of substantially equal values configured in parallel, wherein the first switching circuit is configured as an input capacitance of the switched capacitor integrator, the method comprising:
    performing a conversion sequence a specified number of times, resulting in a final DAC output voltage and a corresponding final output charge, the conversion sequence comprising;
       selecting a first subset of the one or more bits and a second subset of the one or more bits, wherein the first subset and the second subset are mutually exclusive, and wherein a union of the first subset and the second subset equal the one or more bits;
       performing a first charging sequence for each bit of the first subset;
       performing a second charging sequence for each bit of the second subset;
       integrating a first output voltage present across the first capacitor, resulting in a first intermediate DAC output voltage and a corresponding first output charge;
       performing the first charging sequence for each bit of the second subset; and
       performing the second charging sequence for each bit of the first subset;
       integrating a second output voltage present across the second capacitor, resulting in a second intermediate DAC output voltage and a corresponding second output charge;

wherein the first charging sequence comprises:
charging the first capacitor to a conversion voltage level resulting in a first conversion charge on the first capacitor;
redistributing the first conversion charge and a first previous charge present on the second capacitor between the first capacitor and the second capacitor;

wherein the second charging sequence comprises:
charging the second capacitor to a conversion voltage level resulting in a second conversion charge on the second capacitor;
redistributing the second conversion charge and a second previous charge present on the first capacitor between the first capacitor and the second capacitor;

wherein the final DAC output voltage is free of odd-order capacitor mismatch errors between the first capacitor and the second capacitor;

wherein the final DAC output voltage is free of second-order capacitor mismatch errors between the first capacitor and the second capacitor, for up to a specified number of bits.

12. The method of claim 11;
wherein for a bit value of 1 the conversion level is a reference voltage; and
wherein for a bit value of 0 the conversion level is a common ground.

13. The method of claim 11;
wherein the first subset is uniquely different for each conversion sequence of said performing the conversion sequence the specified number of times; and
wherein the second subset is uniquely different for each conversion sequence of said performing the conversion sequence the specified number of times.

14. The method of claim 11 further comprising:
transferring the final DAC output voltage to a hold circuit coupled to the switched capacitor integrator; and
holding the final DAC output voltage on the hold circuit.

15. The method of claim 11;
wherein performing the first charging sequence comprises performing the first charging sequence from LSB to MSB; and
wherein performing the second charging sequence comprises performing the second charging sequence from LSB to MSB.

16. The method of claim 11;
wherein said selecting the first subset a specified number of times and said selecting the second subset a specified number of times are performed in a manner that even-order capacitor mismatch errors are minimized in order of priority from MSB to LSB.

17. The method of claim 11;
wherein said selecting the first subset a specified number of times and said selecting the second subset a specified number of times are performed in a manner that second-order capacitor mismatch errors are eliminated in order of priority from MSB to LSB down to a specified number of bits.

18. The method of claim 11;
wherein the conversion sequence further comprises transferring the second output charge to the first capacitor and the second capacitor.

19. The method of claim 11 further comprising transferring the final output charge to the first capacitor and the second capacitor, resulting in a new final DAC output voltage.

20. The method of claim 19 further comprising:
transferring the new final DAC output voltage to a hold circuit coupled to the switched capacitor integrator; and
holding the new final DAC output voltage on the hold circuit.

21. A method for digital to analog conversion, the method comprising: performing a first charge redistribution on a switching circuit comprising a first capacitance and a second capacitance, the first and second capacitances being substantially equal in size and subject to a capacitance mismatch error;
performing a second charge redistribution on the switching circuit, wherein the second charge redistribution is performed in a complementary fashion to the first charge redistibution, thereby producing two charge distributions; and
summing the two charge distributions, thereby producing a first output voltage representative of a converted binary number and substantially free of odd-order components of the capacitance mismatch error.

22. The method of claim 21; wherein said performing the first charge redistribution comprises charging the first capacitance to a conversion level of a first number of times and charging the second capacitance to the conversion level a second number of times; and
wherein said performing the second charge redistribution comprises charging the first capacitance to the conversion level the second number of times and charging the second capacitance to the conversion level the first number of times.

23. The method of claim 22, wherein if charging the first capacitance during said performing the first charge redistribution is performed for a respective bit of the binary number, then charging the second capacitance during said performing the first charge redistribution is not performed for the respective bit, and charging the first capacitance during said performing the second charge redistribution is not performed for the respective bit, but charging the second capacitance during said performing the second charge redistribution is performed for the respective bit.

24. The method of claim 22 wherein if charging the second capacitance during said performing the first charge redistribution is performed for the respective bit, then charging the first capacitance during said performing the first charge redistribution is not performed for the respective bit, and charging the second capacitance during said performing the second charge redistribution is not performed for the respective bit, but charging the first capacitance during said performing the second charge redistribution is performed for the respective bit.

25. The method of claim 21, wherein said performing the first charge redistribution and said performing the second charge redistribution each comprise redistributing charge stored on the first capacitance and the second capacitance to be shared substantially equally between the first capacitance for each bit of the binart number.

26. The method of claim 21 further comprising performing the first charge redistribution, the second charge redistribution, and said summing a specified number of times, thereby producing a second output voltage;
wherein each time the first charge redistribution and the second charge redistribution are performed, said performing the first charge redistribution and said performing the second charge redistribution comprise charging the first capacitance and the second capacitance in a respective specified sequence; and p1 wherein each respective specified sequence is determined such that in performing the first charge redistribution, the second charge redistribution, and said summing the specified number of times, even-order components of the capacitance mismatch error present in the second output voltage are reduced.

27. The method of claim 26, wherein each respective specified sequence is determined such that in performing the first charge redistribution, the second charge redistribution, and said summing the specified number of times, the second output voltage is substantially free of second-order components of the capacitance mismatch error for up to a specified number of bits.

28. The method of claim 26, wherein the second output voltage is a final DAC output voltage.

29. The method of claim 21,
wherein said performing the first charge redistribution comprises:
applying a first switching sequence to the switching circuit, thereby producing a first voltage across the first capacitance and across the second capacitance; and
integrating the first voltage;
wherein said performing the second charge redistibution comprises:
applying a complementary switching sequence corresponding to the first switching sequence to the circuit, thereby producing a second voltage across the first capacitance and across the second capacitance; and
integrating the second voltage; and
wherein if during said integrating the first voltage, the first voltage is obtained from the first capacitance, then during said integrating the second voltage, the second voltage is obtained from the second capacitance, and if during said integrating the first voltage, the first voltage is obtained from the second capacitance, then during said integrating the second voltage, the second voltage is obtained from the first capacitance.

30. The method of claim 21, wherein the first output voltage is a final DAC output voltage.

31. The method of claim 21, wherein the first switching circuit is configured as an input capacitance of a switched capacitor integrator.

32. The method of claim 31, wherein the switched capacitor integrator is comprised in a DAC.

33. A system operable to perform digital to analog conversion, the system comprising:
a switched capacitor integrator; and
a switching circuit configured as an input capacitance of the switched capacitor integrator and comprising a first capacitance coupled to a second capacitance, the first and second capacitances substantially equal in size and subject to a capacitance mismatch error;
wherein the switching circuit is operable to redistribute charge stored on the first capacitance, to be shared substantially equally by the first capacitance and the second capacitance;
wherein the switching circuit is further operable to redistribute charge stored on the second capacitance, to be shared substantially equally by the first capacitance and the second capacitance;
wherein performing a first charge redistribution and a corresponding second charge redistribution on the switching circuit for converting a binary number results in two charge distributions;
wherein the second charge redistribution is performed in a complementary fashion to the corresponding first charge redistribution; and
wherein the switched capacitor integrator is operable to produce a first output voltage representative of the binary number and substantially free of odd-order components of the capacitance mismatch error by summing the two charge distributions.

34. The system of claim 33, wherein the first charge redistribution, the corresponding second charge redistribution, and said summing form a conversion sequence for the binary number, wherein for each bit of the binary number, charge is redistributed between the first capacitance and the second capacitance.

35. The system of claim 34, wherein performing the conversion sequence a specified number of times and integrating the first output voltage at the end of each conversion sequence results in a final output voltage representative of the binary number and substantially free of second-order capacitor mismatch errors for up to a specified number of bits.

36. The system of claim 33;
wherein performing the first charge redistribution comprises applying a first switching sequence to the switching circuit, thereby producing a first voltage across the first capacitance and across the second capacitance; and
wherein performing the second charge redistribution comprises applying a complementary switching sequence corresponding to the first switching sequence to the first switching circuit, thereby producing a second voltage across the capacitance and across the second capacitance.

37. The system of claim 36;
wherein, in applying the first switching sequence, the first capacitance is charged to a conversion level a first number of times and the second capacitance is charged to the conversion level a second number of times; and
wherein in applying the complementary switching sequence, the first capacitance is charged to the conversion level the second number of times and the second capacitance is charged to the conversion level the first number of times.

38. The system of claim 37;
wherein, in applying the first switching sequence, if the first capacitance is charged to the conversion level for a respective bit of the binary number then the second capacitance is not charged to the conversion level for the respective bit, and in applying the complementary switching sequence the first capacitance is not charged to the conversion level for the respective bit, but the second capacitance is charged to the conversion level for the respective bit; and
wherein, in applying the first switching sequence, if the second capacitance is charged to the conversion level for the respective bit, then the first capacitance is not charged to the conversion level for the respective bit, and in applying the complementary switching sequence the second capacitance is not charged to the conversion level for the respective bit, but the first capacitance is charged to the conversion level for the respective bit.

39. The system of claim 36, wherein an integrated sum of the first voltage and the second voltage comprises a second output voltage respectively of the binary number and substantially free of odd-order error components of the capacitance mismatch error.

40. The system of claim 36, wherein if the first voltage is obtained from the first capacitance then the second voltage is obtained from the second capacitance, and if the first voltage is obtained from the second capacitance then the second voltage is obtained from the first capacitance.

41. The system of claim 33,
- wherein the switched capacitor integrator comprises a first operational transconductance amplifier (OTA); and
- wherein the switching circuit is coupled to an inverting input of the first OTA.

42. The system of claim 33, further comprising a hold circuit coupled to an output of the switched capacitor integrator, wherein the hold circuit is operable to hold the final output voltage.

43. The system of claim 42, wherein the hold circuit comprises:
- a second OTA; and
- a hold capacitor coupled to a non-inverting input of the second OTA;
- wherein the output of the switched capacitor integrator is coupled to the non-inverting input of the second OTA.

* * * * *

UNITED STATES PATENT AND TRADEMARK OFFICE
CERTIFICATE OF CORRECTION

PATENT NO. : 6,924,760 B1
DATED : August 2, 2005
INVENTOR(S) : Scott C. McLeod

It is certified that error appears in the above-identified patent and that said Letters Patent is hereby corrected as shown below:

Column 20,
Line 19, please delete "redistibution" and substitute -- redistribution --;
Line 58, please delete "binart" and substitute -- binary --.

Column 21,
Line 1, please delete "p1";
Line 25, please delete "redistibution" and substitute -- redistribution --.

Column 22,
Line 65, please delete "respectively" and substitute -- representative --.

Signed and Sealed this

Thirteenth Day of September, 2005

JON W. DUDAS
*Director of the United States Patent and Trademark Office*